Figure 1:
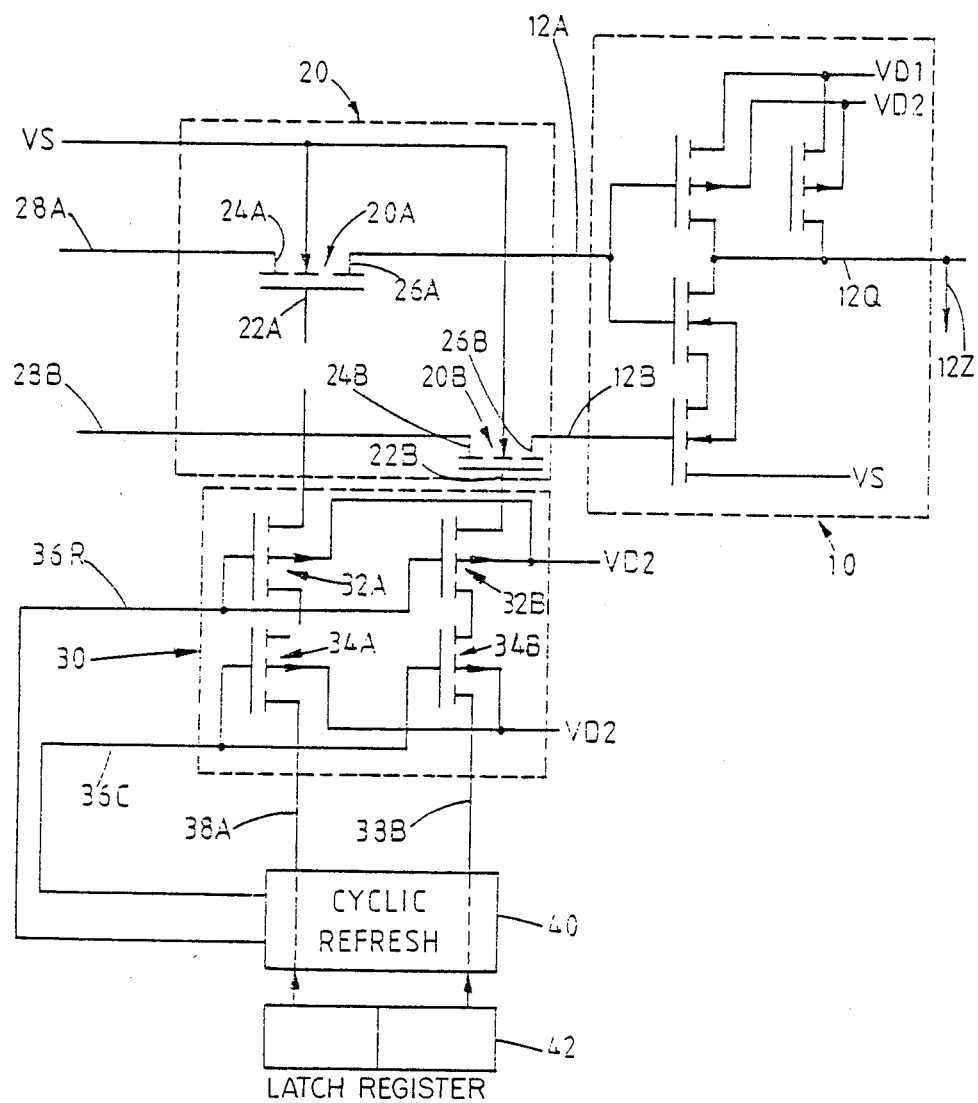

United States Patent [19]

Austin

[11] Patent Number: 4,868,419

[45] Date of Patent: Sep. 19, 1989

[54] GATED TRANSMISSION CIRCUIT (ON-CHIP)

[75] Inventor: Kenneth Austin, Hartford, United Kingdom

[73] Assignee: Pilkington Micro-Electronics Limited, Merseyside, England

[21] Appl. No.: 905,846

[22] Filed: Sep. 10, 1986

[30] Foreign Application Priority Data

Oct. 23, 1985 [GB] United Kingdom ............. 8526143
Jul. 19, 1986 [GB] United Kingdom ............. 8617705

[51] Int. Cl.⁴ .............. H03K 19/00; H03K 19/096; H03K 19/017; H03K 17/687
[52] U.S. Cl. ........................... 307/440; 307/448; 307/443; 307/481; 307/468; 307/583
[58] Field of Search ............ 307/440, 443, 448, 451, 307/571, 572, 573, 575, 577, 584, 585, 475, 468, 481, 583

[56] References Cited

U.S. PATENT DOCUMENTS 3,675,144 7/1972 Zuk ..................... 307/475
4,595,845 6/1986 Briggs ................. 307/443
4,652,773 3/1987 Cartwright, Jr. ...... 307/451

FOREIGN PATENT DOCUMENTS 0086526 7/1981 Japan ................... 307/584
0059626 4/1983 Japan ................... 307/584
0083431 5/1983 Japan ................... 307/584

Primary Examiner—Stanley D. Miller
Assistant Examiner—Trong Quang Phan
Attorney, Agent, or Firm—Willian Brinks Olds Hofer Gilson & Lione

[57] ABSTRACT

A gated binary signal transmission circuit in a field effect semiconductor chip comprises a single signal-pass transistor connected between a bit signal input to one of its electrodes and a bit signal output from another of its electrodes. Its control electrode is connected for temporary energizations by switching circuitry operative only at prescribed intervals, the single signal-pass transistor being operative to pass signals between such energizations of its control electrode. Conduction of the single-pass transistor between energizations will persist, though with some decay, due to inherent capacitance and the control electrode being left "floating" between energizations.

13 Claims, 2 Drawing Sheets

GATED TRANSMISSION CIRCUIT (ON-CHIP)

This invention relates to electronic circuitry of semiconductor integrated circuits and has particular reference to providing a gated digital signal transmission circuit that is efficiently implemented in semiconductor field effect integrated circuits.

It is inherent in field effect semiconductor technology that capacitance is associated with all circuit elements, as formed, i.e. not only with formation of passive circuit elements such as specifically-formed capacitors, but also with active circuit elements, such as p-channel and n-channel transistors. Much attention has been directed on the one hand to reducing such capacitance for switching type transistors in order to improve speed of operation, and on the other hand to devising transistor element structures that trap electrons and then hold and exhibit a capacitive charge virtually permanently.

So-called MOS has become a popular technology for digital semiconductor field effect integrated circuits (chips) used in computers and allied data processing industries. Developments of the original metal-oxide-semiconductor substrate construction include substituting enhanced conduction semiconductors, e.g. polysilicon, for metal, and incorporation of other layers such as nitride (MNOS). Examples of the wide application of MOS include read-only memories (ROMs), whether of programmable type (PROMs) or re-programmable type (EPROMs), and writable memories of dynamic type (DRAMs).

Fast switching is important for DRAMs where it is customary for each bit storage site to include a switching transistor of lowest achievable inherent capacitance and an associated specific capacitor formation. The capacitor formation stores one binary value (normally '1') when the capacitor formation is charged, and otherwise represents the other binary value. Charging or not is controlled by the state of the switching transistor at writing to the memory. Reading is by sensing the state of charge as a voltage and using high impedance sensing circuitry. The capacitor charge will decay but is periodically restored in so-called refresh cycles each normally involving a read operation to sense the capacitor charge state followed by a re-write operation to those sites storing binary '1' values.

Charge trapping is important for EPROMs where charge trapping transistors are each usually associated with load circuit formations. Appropriate trapped charge applied at higher than normal operating logic levels can prevent such a transistor from switching. Non-destructive reading can be attempted by switching and sensing whether or not there is a voltage drop across the associated load. Trapped charges of so-called floating gate or nitride oxide sandwich transistors can be discharged by signals of higher voltage levels than logic levels used for normal chip-operation, or by irradiation, whereupon they are ready for rewriting of the EPROM. Writing, erasing and rewriting is usually carried out by special-purpose equipment, known as EPROM writers.

Where it is required to pass a binary value representative signal in field effect chips, such as CMOS, it is customary to use a so-called transmission gate. Such a CMOS transmission gate typically comprises at least four transistors for signal passage namely a p-channel transistor and a n-channel transistor in parallel each to pass a different one of the two binary value signals and two other transistors acting as an inverter. There may be as many as four more transistors forming a latch to set the state of the transmission gate on a stored-state basis of operation (which would be required together with further transistors for selection purposes in relation to later-discussed programmable logic array chips).

It will be appreciated that reading from DRAM chips involves effectively sensing a voltage condition for each bit site which voltage condition is dependent on stored capacitive charge. It will be further appreciated that such sensing is quite different from requirements of a transmission gate in that the latter must effectively pass signals from its input to its output, i.e. reproduce recognizable and operative equivalent signals, normally logic "high" and logic "low".

There is a need for much simpler transmission gate circuitry. Thus, without it, attempts to improve the capability of programmable logic array chips (PLAs), appear to involve increasing the complexity of logic cells, especially if ready reprogrammability is to be obtained in actual operation on a reconfigurable basis.

The long-established PLA chips devoted much of their active areas to formation of a matrix of all possible connections of gate inputs and outputs with generally irreversible interconnection selection at crossing points and with the actual gate circuits generally restricted to edges of those areas. It is only possible significantly to improve the gate capacity of PLAs by reducing the area devoted to interconnection relative to that devoted to logic circuitry, and, particularly, by distributing the logic circuitry cells more evenly over the active chip areas. We have, ourselves, proposed a new and advantageous configurable logic chips for PLAs with a substantially uniform distribution of logic circuits, preferably simple conventional logic gates each having a single logic function. However, to achieve reconfigurability there is a problem if convention transmission gates or multiplexers are used for interconnection purposes as they each need too much chip area to be able to service individual inputs and outputs of a reasonable number of simple logic gate circuits. It is believed to be particularly advantageous to be able to use simple logic gates, for example two-input NAND gates. Accepting such limitations leads to providing large and functionally configurable logic circuitry cells on the chip, but in relatively small numbers, and thus with less flexibility and/or familiarity for circuit designers used to designing for ULAs.

It is an object of this invention to provide relatively simple signal-transmission circuitry for field effect semiconductor chips.

According to this invention a gates binary signal transmission circuit in a field effect semiconductor chip comprises a single signal-pass transistor connected between a bit signal input to one of its electrodes and a bit signal output from another of its electrodes and having a control electrode (by energisation of which conduction is normally established between the first and second electrodes) connected for temporary energisations by switching circuitry operative only at prescribed intervals, the single signal-pass transistor being operative to pass signals between said energisations of its control electrode. Those energisations render the signal signal-pass transistor conductive, i.e. enabled for conduction, and that conduction is caused to persist, though with some decay, hence periodic refreshing at said prescribed intervals. Inherent capacitance of the single signal-pass transistor inevitably results in accumulation of charge during each said energisation applied to its control electrode. The switching circuitry operates, not to apply discharge voltage between such energisations at said prescribed intervals, but rather to leave the control electrode "floating" between refreshes by said energisations. Such single signal-pass transistors are, of course, capable of continuous signal passage despite only intermittent energisation of their control electrodes.

Embodiments of this invention are particularly useful in providing inputs to or outputs from logic gate circuitry on the same chip, particularly to determining whether or not such input or output is to be capable of receiving or providing a bit signal. Application to programmable logic arrays will be evident, i.e. selecting whether or not a possible connection path to a logic gate input or from its output is or is not conducting. For conduction, periodic energisation of the control electrode forces saturation of the single signal-pass transistor, and intervals between such energisations are kept short enough not to lose its 'on' state, i.e. to recur before inherently arising capacitive charge drains away to an extend preventing any significant conduction. Another switchable transistor is suitable for controlling application of said energisation, and it is feasible to have a further switchable transistor in series therewith, or replace those two switching transistors by a dual-gate MOSFET, in order to provide for coincident current selection for the purposes of enabling energisations of the associated single signal-pass transistor. Such provision is particularly useful in arranging that enablement takes place synchronously with reading out a relevant bit location of a ROM (one bit location per signal-pass transistor) and actual energisation depends on the bit value stored at that location.

The single signal-pass transistor hereof represents a dramatic simplification compared with conventional transmission gates. Also, compared with action of a DRAM bit storage site, there is effectively storage and switching in the same transistor. Further compared with a DRAM, there is no provision for a read operation prior to each refresh as the required conduction state will be known from externally available signals or memory contents representing a prescribed configuration.

Actual capacitance at a field effect transistor of a chip depends upon geometries and materials of the MOS transistor formation, and it is further proposed herein that signal-pass transistors be formed such as to enhance capacitance, at least relative to other (switching) transistor formations of the chip (which can follow the main line of development towards reducing capacitance). Then, intervals between refreshes may be longer and/or voltage fidelity of output-to-input bit signals improved. It is, however, emphasised that viable implementation of this invention results using standard chip fabrication techniques for CMOS at 3-micron feature size and with said specific intervals of about 1 millisecond.

It will be appreciated that single signal pass transistor circuitry hereof may not operate with the usual voltage fidelity associated with prior transmission gates, typically giving logic "high" at 5 volts and logic "low" at 0 volts, due to transistor threshold level effects (referred to in the art as VT). That can be met by using suitably different operating voltage, i.e. to give normal logic level output signals (see below), or by accepting a lower speed of operation of an associated logic circuit if such logic circuit, say a simple logic gate, is so operable below normally specified voltage (which it often is).

Using n-channel for the single-pass transistor, threshold level effects, including so-called "body-effect", result in degradation of a high level logic signal. Allowance needs to be made for at least one transistor threshold level, so that substantially more than the currently commonplace +5 volts (for logic "high") will be required. However, using a p-channel signal-pass transistor, (for which "body effect" contribution to VT is less), degradation will effectively be at logic 'low' level, i.e. will not need more than normal logic "high" level (5 volts) to turn fully off and, further, will not need more than −5 volts to turn the p-channel 'on' even via two switching transistors.

It may be seen as advantageous to operate between +5 volts and −5 volts rather than between a voltage substantially greater than +5 volts and zero. There is basic compatibility with the normal logic "high" level, and requirement for power supply also with the equivalent negative level is quite trivial technically and economically, and there would, in any event, be only low current consumption at −5 volts compared with the rest of the chip.

It is apparent that minimum feature sizes and widths associated with MOS transistor implementation will decrease as integrated circuit technology continues to develop, say from 3-micron to 1.5 - micron even 1 - micron, and consequenlty allow inherently faster response. That would result in acceptable speed for lower logic voltages. Then, it is feasible to use n-channel single signal-pass transistors, as will be specifically described.

Figure 2A:
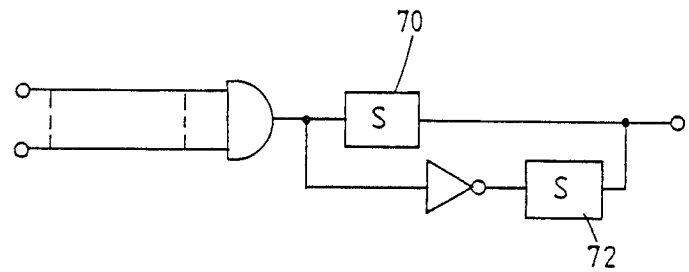
Figure 2B:
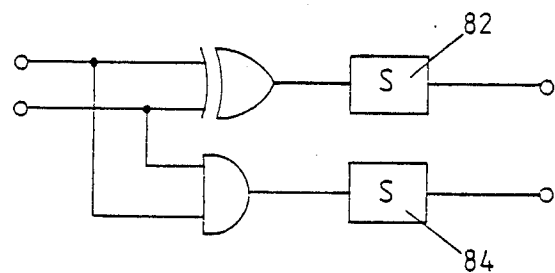
Figure 2C:
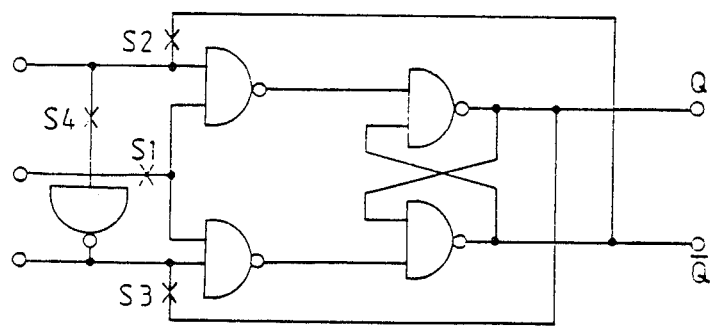

Specific implementation of this invention will now be described by way of example with reference to the accompanying drawings, in which FIG. 1 shows a circuit diagram for a logic gate site with its gate inputs having selectable connections using this invention; and FIGS. 2A–2C show application to configurable logic circuits.

In the drawings, referring first to FIG. 1, the circuitry shown in readily implemented in a CMOS chip. Section 10 shows four transistors in a generally conventional circuit configuration operative as a two-input NAND gate having inputs 12A and 12B and output 12Q, but with supply voltages VD1, VD2 and substrate voltage VS applied as discussed further below. Section 20 shows n-channel single signal-pass transistors of this invention at 20A and 20B to pass signals for inputs 12A and 12B, respectively, of the gate 10. Section 30 shows switching transistors for energising control electrodes (gates) 22A and 22B of the single signal-pass transistors, and shown in pairs 32A and 34A, 32B and 34B for coincident current selection of the single signal-pass transistors 20A, 20B via the lines 36R and 36C.

The single signal-pass transistors 20A and 20B have their source and drain electrodes 24A, 26A and 24B, 26B, respectively, connected in series between the gate inputs 12A and 12B and signal lines 28A and 28B, respectively. The single signal-pass transistors 20A and 20B determine whether or not signals on the lines 28A, 28B, respectively, are passed in a recognisable and operative manner to the gate inputs 12A, 12B. If either of the transistors 20A, 20B is enabled for conduction it will pass bit signals, otherwise not.

Either of the single signal pass transistors 20A and 20B can be saturated and thus rendered capable of conducting if the corresponding switching transistors 32A, 34A and 32B, 34B are themselves enabled for conduction by signals on lines 36R and 36C, and a suitable energising signal is available on the corresponding one of energisation lines 38A and 38B. Presence or absence of a suitable voltage level on energising lines 38A, 38B determines whether or not the corresponding single signal pass transistor 20A, 20B is turned 'on'.

For the n-channel signal-pass transistors shown in the drawing, and for logic gate operation below the customary +5 volts (for logic "high") but at the customary 0 volts (for logic "low"), VD1 can be +3 volts with VD2 at +5 volts and VS at zero volts. For p-channel signal-pass transistors (not shown), the corresponding voltages would be +5 volts for VD1 and VD2, zero volts at VS for the logic gate, but with −5 volts at VS for the signal-pass transistors.

The energising lines 38A, 38B are shown coming from refresh circuitry 40 serving to apply signals to the energising lines 38 at prescribed intervals, say in accordance with the contents of a latch register 42, which could be an external store location or indeed any source of appropriate binary signals of which one value represents 'on' and the other "off" for the single signal pass transistors 20A, 20B. The refresh circuitry 40 is also shown, for convenience, as supplying enabling selection signals to the lines 36R and 36C.

It will be appreciated that the simplest circuit hereof would be with only a single switching transistor, say 32A, present, and only coincidence of signals on lines 36R and 38A required for turning 'on' the transistor 32A. In fact, the line 38A could then be permanently connected to a suitable voltage level for applying energising signal whenever the switching transistor 32A was turned 'on'. Then, of course, refreshing could be entirely by periodic application of signals on line 36R, which switch the transistor 32A 'on' only if the single signal-pass transistor 20A is to be enabled for passing signals.

Importantly hereto, the dynamic nature of the illustrated transmission gates, each comprised of a single signal-pass transistor 20 and switching circuitry 32, 34, requires (when conduction is to be enabled) refreshing at intervals such that the single signal-pass transistor remains sufficiently conductive to pass an effective signal to the connected gate input 12. Such passing action thus applies at and during cyclic refreshing. Between refreshes, the line 38 is left "floating".

At first setting up of a conduction state for a single signal-pass transistor 20 hereof, it will switch by saturation of its channel due to switching on transistors 32 and 34 and in the presence of energisation signal on line 38. In the process of doing so, a capcitive charge inevitably builds up due to "holes" (elecorns for a p-channel signal-pass transistor) injected through its control electrode 22 that tend to discharge after transistors 32, 34 switch off in order to go non-conductive. Before that happens the transistors 32, 34 will be switched on again and the signal on line 38 re-applied for a short time in order to re-saturate the channel fo the single signal-pass transistor (20). Effectively, there are repetitive write cycles to maintain the state of the single signal-pass transistor relative to a reference determined via the energisation line.

Branches 12X and 12Y from the inputs 12A, 12B indicate use of single signal pass transistor circuitry hereof for choosing input lines other than 28A and 28B, respectively, as enabled feeds to the two-input NAND gate 10. Choice of outputs might be similarly provided for from branch 12Z.

One application envisaged is, of course, in relation to improved PLAs, particularly of the type (to which we have other relevant patent applications) where their logic gates are distributed substantially evenly over a chip in a matrix array. Then, each logic gate site could correspond to FIG. 1, say with some inputs 10A, 10X directly from prescribed other gates and other such inputs from longer range connection paths (typically row and column following) to which branch outputs 12A, 12X can also be selectably connected.

Self-evidently, there are other applications wherever user- or machine-selection of connections to modify or control a chip's action is desirable. For example, it may be desired to provide complex and configurable logic cells, which clearly offer scope for using embodiments of this invention to set up desired ones of possible connections, for particular logic configurations, say instead of signal-path-switching type circuits for choosing which of possible outputs shall receive an input signal. Very simple examples are shown in FIGS. 2A, B, C.

In FIG. 2A, selection circuitry (described above for 20 and 30) could be used at 70, 72 to allow choice of a true AND function or a NAND function.

In FIG. 2B, selection circuitry can be used relative to a half-adder circuit on its outputs (see 82, 84) to give a choice of half-adder if two outputs are to be allowed (both 82 and 84 conducting) or Exclusive-OR (only 82 conducting) or AND (only 84 conducting) functions, at least for single output logic.

In FIG. 2C, selection circuitry can be used relative to flip-flop circuitry and selection circuitry this time shown as crosses and labelled S1 to S4. A basic SR flip-flop obtains if all selection circuits S1 to S4 are off, a clocked SR flip-flop if only S1 is conducting, a D-type when only S1 and S4 are conducting, and a T-type when only S4 is off.

I claim:

1. In a field effect semiconductor integrated circuit at least one gated binary signal transmission circuit formation, which formation comprises
    a single signal-pass transistor connected between a bit signal input to on of its electrodes and a bit signal output from another of its electrodes and having a conduction control electrode,
    switching circuitry connected to said conduction control electrode and serving to apply thereto temporary energisations at prescribed intervals,
    the signal-pass transistor being operative to pass whatever succession of signals may appear between successive said energisations relying on conduction persisting due to inherent and undischarged capacitance of the signal-pass transistor, and wherein the switching circuitry comprises means, coupled to the conduction control electrode, and operative to leave the conduction control electrode floating during selected time intervals between said temporary energisations.

2. An integrated circuit according to claim 1, wherein the switching circuitry includes means for supplying signals determining said energisations of said conduction control electrodes of the single signal-pass transistor and means for supplying enabling signals to control whether the switching circuitry passes the energisations signals.

3. An integrated circuit according to claim 1, wherein the switching circuitry includes a first field effect transistor connected with its source-drain in series with said conduction control electrode and further connected to be enabled by enabling signals for conduction fo signals determining said energisations of said conduction control electrode of the single signal-pass transistor, otherwise to leave the conduction control electrode floating.

4. An integrated circuit according to claim 3, wherein the switching circuitry includes a second field effect transistor connected in series with the first field effect transistor to control enablement of the latter for conduction in accordance with two enabling signals.

5. An integrated circuit according to claim 4, wherein the second field effect transistor is connected in series with the first field effect transistor, and to be enabled for said conduction so that the signal-pass transistor is energised for conduction only when both said first and second field effect transistors are enabled on a coincident basis and an energisation signal is applied via both said first and second field effect transistors.

6. An integrated circuit according to claim 3, wherein said first field effect transistor is of a channel type opposite to that of the signal-pass transistor.

7. An integrated circuit according to claim 2, comprising refresh control circuitry operative repetitively at appropriate intervals to supply enabling signals to said switching circuitry.

8. An integrated circuit according to claim 7, comprising a latch register controlling supply of energisation signals.

9. An integrated circuit according to claim 1, further comprising a logic circuit having inputs and outputs, wherein at least one of the inputs and outputs includes selectable connection paths each containing a said single signal-pass transistor.

10. An integrated circuit according to claim 1, wherein the integrated circuit includes a plurality of additional transistors, and wherein the inherent gate capacitance of the signal-pass transistor is enhanced relative to said additonal transistors of the integrated circuit.

11. In a field effect semiconductor integrated circuit cyclically operable to process data signals at one rate, at least one binary signal transmission circuit formation selectable as to whether or not it transmits between a bit signal input and a bit signal output, which formation comprises:

a single signal-pass transistor connected between a bit signal input to one of its electrodes and a bit signal output from another of its electrodes, and having a conduction control electrode by successive energisations of which it is rendered and maintained conductive;

switching circuitry connected to said conduction control electrode and serving to select the conduction state of said transistor by enabling application to said conduction control electrode, at a rate lower than said one rate, of successive temporary energisations at prescribed intervals;

the single signal-pass transistor, when selected for conduction, being operative to pass data signals throughout intervals between successive ones of said temporary energisations relying on conduction persisting due to inherent capacitance of the signal-pass transistor being refreshed at said prescribed intervals, and wherein the switching circuitry comprises means, coupled to the conduction control electrode, for leaving the conduction control electrode floating during intervals between successive ones of said temporary energisations.

12. Iin a field effect semiconductor integrated circuit at least one selectable binary signal transmission circuit formation, which formation comprises:

a single signal-pass transistor having inherent capacitance and being connected between a bit signal input to one of its electrodes and a bit signal output from another one of its electrodes and having a control electrode effective to place the transistor in a conducting state in response to an energisations signal;

switching circuitry connected to said control electrode and comprising means for applying successive energisation signals to said control electrode at prescribed intervals spaced apart in time, each of said energisation signals serving to effect refreshing of a capacitive charge in said inherent capacitance;

wherein the single signal-pass transistor remains in the conducting state and is operative to pass signals, including signals appearing during the intervals between said energisation signals by virtue of conduction persisting due to refreshed inherent capacitance of the signal-pass transistor, and wherein the switch circuitry comprises means, coupled to the control electrode, for leaving the control electrode floating during the intervals between the energisation signals.

13. In a field effect semiconductor integrated circuit at least one gated binary signal transmission circuit formation, which formation comprises a single signal-pass transistor connected between a bit signal input to one of its electrodes and a bit signal output from another of its electrodes and having a conduction control electrode, switching circuitry connected to said conduction control electrode and serving to apply thereto temporary energisations at prescribed intervals, and a plurality of additional transistors, the signal-pass transistor being operative to pass whatever succession of signals may appear between successive said energisations relying on conduction persisting due to inherent and undischarged capacitance of the signal-pass transistor, and wherein the inherent gate capacitance of the signal-pass transistor is enhanced relative to each of said plurality of additional transistors of the integrated circuit.

* * * * *

UNITED STATES PATENT AND TRADEMARK OFFICE
CERTIFICATE OF CORRECTION

PATENT NO. : 4,868,419

DATED : September 19, 1989

INVENTOR(S) : KENNETH AUSTIN

It is certified that error appears in the above-identified patent and that said Letters Patent is hereby corrected as shown below:

In column 2, line 36, before "reconfigurability" please insert --in-situ--.

In column 2, line 37, please delete "convention" and substitute therefor --conventional--.

In column 3, line 23, please delete "extend" and substitute therefor --extent--.

In column 5, line 52, please delete "capcitive" and substitute therefor --capacitive--.

In column 5, line 53, please delete "electorns" and substitute therefor --electrons--.

In column 5, line 59, please delete "fo" and substitute therefor --of--.

In claim 1, In column 6, line 44, please delete "on" and substitute therefor --one--.

UNITED STATES PATENT AND TRADEMARK OFFICE
CERTIFICATE OF CORRECTION

PATENT NO. : 4,868,419

DATED : September 19, 1989

INVENTOR(S) : KENNETH AUSTIN

It is certified that error appears in the above-identified patent and that said Letters Patent is hereby corrected as shown below:

In claim 12, column 8, line 12, please delete "Iin" and substitute therefor --In--.

Signed and Sealed this

Fifteenth Day of September, 1992

Attest:

DOUGLAS B. COMER

*Attesting Officer*      *Acting Commissioner of Patents and Trademarks*